(12) United States Patent
Gutt et al.

(10) Patent No.: US 7,851,913 B2
(45) Date of Patent: Dec. 14, 2010

(54) SEMICONDUCTOR DEVICE INCLUDING A POWER DEVICE WITH FIRST METAL LAYER AND SECOND METAL LAYER LATERALLY SPACED APART

(75) Inventors: Thomas Gutt, Taufkirchen (DE); Dirk Siepe, Warstein (DE); Thomas Laska, Munich (DE); Michael Melzl, Neutraubling (DE); Matthias Stecher, Munich (DE); Roman Roth, Sattendorf (AT)

(73) Assignee: Infineon Technologies AG (DE)

( * ) Notice: Subject to any disclaimer, the term of this patent is extended or adjusted under 35 U.S.C. 154(b) by 886 days.

(21) Appl. No.: 11/602,024

(22) Filed: Nov. 20, 2006

(65) Prior Publication Data
US 2008/0122091 A1    May 29, 2008

(30) Foreign Application Priority Data
Nov. 6, 2006    (DE) .................. 10 2006 052 202

(51) Int. Cl.
  *H01L 23/48* (2006.01)
  *H01L 23/52* (2006.01)
  *H01L 29/40* (2006.01)
(52) U.S. Cl. .................. 257/750; 257/766; 257/781
(58) Field of Classification Search .................. 257/750, 257/766, E29.143, E21.536, 781
See application file for complete search history.

(56) References Cited

U.S. PATENT DOCUMENTS

| | | | |
|---|---|---|---|
| 4,077,854 A * | 3/1978 | Estep et al. .................. 205/159 |
| 5,739,587 A | 4/1998 | Sato | |
| 5,929,521 A | 7/1999 | Wark et al. | |
| 6,864,578 B2 | 3/2005 | Angell et al. .................. 257/737 |
| 2002/0056901 A1 | 5/2002 | Ono et al. .................. 257/690 |
| 2003/0151141 A1* | 8/2003 | Matsuki et al. .................. 257/746 |
| 2004/0135223 A1 | 7/2004 | Allman et al. | |
| 2005/0067709 A1 | 3/2005 | Bachman et al. .................. 257/763 |
| 2005/0073058 A1 | 4/2005 | Kuo et al. .................. 257/786 |
| 2006/0091536 A1 | 5/2006 | Huang et al. .................. 257/734 |
| 2006/0145342 A1 | 7/2006 | Maynollo et al. .................. 257/734 |
| 2006/0163742 A1 | 7/2006 | Stecher .................. 257/766 |
| 2007/0090496 A1* | 4/2007 | Otremba .................. 257/666 |

FOREIGN PATENT DOCUMENTS

| | | |
|---|---|---|
| DE | 699 12 565 T2 | 9/2004 |
| DE | 103 58 325 A1 | 7/2005 |
| DE | 10 2004 057 485 A1 | 6/2006 |
| DE | 10 2004 061 307 A1 | 6/2006 |
| EP | 1006576 | 11/2003 |

* cited by examiner

*Primary Examiner*—William M. Brewster
(74) *Attorney, Agent, or Firm*—Banner & Witcoff, Ltd.

(57) ABSTRACT

A semiconductor device exhibits a first metal layer, made of a first metal, with at least one contiguous subsection. At least one second metal layer, made of a second metal, is placed on the contiguous subsection of the first metal layer. The second metal is harder than the first metal. The second metal layer is structured to form at least two layer regions, which are disposed on the contiguous subsection of the first metal layer. The second metal exhibits a boron-containing or phosphorus-containing metal or a boron-containing or phosphorus-containing metal alloy.

37 Claims, 9 Drawing Sheets

SEMICONDUCTOR DEVICE INCLUDING A POWER DEVICE WITH FIRST METAL LAYER AND SECOND METAL LAYER LATERALLY SPACED APART

PRIORITY

This application claims priority from German Patent Application No. DE 10 2006 052 202.8 which was filed on Nov. 6, 2006, and is incorporated herein by reference in its entirety.

TECHNICAL FIELD

The present invention is related to semiconductor devices.

BACKGROUND

Semiconductor devices, for example integrated circuits and power semiconductors, typically exhibit an encapsulation for protection. Contact elements comprising contact areas (contact pads) that allow the semiconductor device to make external contact are integrated into the encapsulation. The contacting may be effected, for example, by way of bonding wires. To this end, thin aluminum wires are usually pressed with one of their ends on the bare contact area of the contact element, with the result that they are mechanically deformed and at the same time connected to the top metal layer of the contact element. When bonding, mechanical forces are generated that act on the underlying structures of the semiconductor device and may damage said structures. As miniaturization increases, the thickness of the semiconductor substrates as well as the thickness of the semiconductor devices integrated therein and the layered structures also decreases. Therefore, they are especially sensitive to mechanical stress.

Mechanical stresses also occur when the semiconductor devices heat up, for example, through the dissipation of power while operating the semiconductor device, owing to the varying coefficients of expansion of the individual, interconnected functional layers. Especially in the case of power semiconductors the thermally induced mechanical stresses, for example between the aluminum bonding wires and the silicon substrate and/or between the metallization and the silicon substrate, lead to failures. Furthermore, in particular power semiconductors are subject to a fluctuating thermal stress, which may lead to mechanical stresses.

Mechanical stresses may lead to the formation of cracks inside the individual layers. If the mechanical stress, for example alternating thermal stress, persists, the cracks may extend into other areas of the semiconductor device and have a negative impact on its functionality.

SUMMARY

One embodiment provides a semiconductor device, which exhibits a first metal layer, which is made of a first metal and which exhibits at least one contiguous subsection; and exhibits at least one second metal layer, which is made of a second metal and which is placed on at least the contiguous subsection of the first metal layer. The second metal is harder than the first metal. The second metal layer is structured to form at least two layer regions, which are disposed on the contiguous subsection of the first metal layer. The second metal exhibits a boron-containing or phosphorus-containing metal or a boron-containing or phosphorus-containing metal alloy, and/ or is made of a boron-containing or phosphorus-containing metal or a boron-containing or phosphorus-containing metal alloy.

BRIEF DESCRIPTION OF THE DRAWINGS

The invention is described below with reference to the embodiments, shown in the attached figures. However, the invention is not restricted to the embodiments that are actually described, but rather may be suitably modified and changed. It is within the scope of the invention to combine the individual features and the combination of features of one embodiment with the features and the combination of features of another embodiment.

DETAILED DESCRIPTION

Figure 1:
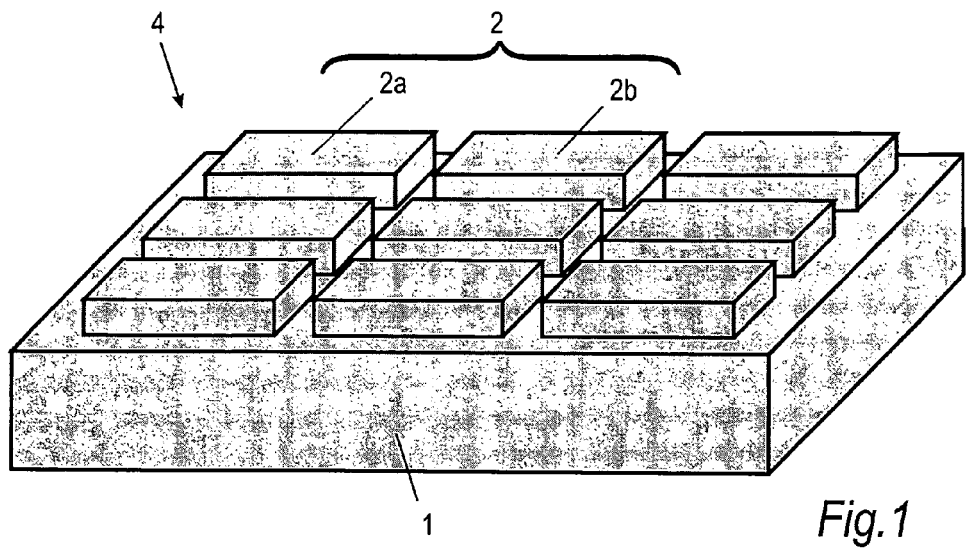
FIG. 1 is a perspective view of a semiconductor device, according to one embodiment.

The invention is explained below with reference to the embodiments.

In one embodiment, the second metal layer exhibits layer regions. According to this embodiment, the second metal layer has an interrupted structure. Preferably the layer regions are separated or spaced apart laterally from each other. That is, they exhibit a certain lateral distance from each other. In this context "laterally" means in the direction of the layer extension, i.e., parallel to the layer surface. With respect to the surface of a semiconductor substrate "laterally" also means parallel to the surface of the semiconductor substrate. In contrast "over" or "one above the other" is defined as in the direction of the layer width, i.e., perpendicularly to the layer surface and/or the semiconductor substrate surface. Thus, the second metal layer comprises individual sections, which are separated from one another. In one embodiment, the second metal layer may be placed directly on the first metal layer. Therefore, "directly placed" is defined as the direct contact between the metal layers.

Even if other layers may be sandwiched between the metal layers, the metal layers are connected together in an electrically conducting manner and have in particular a large-area contact with one another.

In contrast in some embodiments, the third metal layer, which also involves preferably a hard metal layer, may be constructed as a continuous metal layer below the second metal layer. That is, it is then in particular a contiguous metal layer in the region of the subsection of the first metal layer. Therefore, "contiguous metal layer" shall be defined, for example, as a layer that does not consist of individual metal regions or layer regions that are separated from each other.

In some embodiments, the metal layers do not have to be flat, but rather may follow the topology of the layers underneath. However, it is preferred that the subsection of the first metal layer is largely flat.

In another embodiment the second metal layer and the third metal layer define a contact region on the first metal layer. The second metal layer is placed, for example, directly on the third metal layer. In another embodiment the third metal layer is thinner than the second metal layer. In one embodiment, at least a predominant portion of the third metal layer is flat. In particular, the third metal layer may be designed flat in its central region. In one embodiment, the third metal layer exhibits at least two metal sublayers, which are stacked one above the other. In so doing, the individual metal sublayers may be made of a variety of materials, in particular a hard and a soft material. The use of two, three or even more metal sublayers allows greater freedom when adapting all of the properties of the layer system comprising the first, second and third metal layer to the expected stresses. In addition, in some embodiments, an optional contact layer may also be applied on the layered stack comprising a first and a second and/or a first, second, and third layer.

The subsection of the first metal layer, the second metal layer and the third metal layer form together a layered stack and form, for example, a contact element for the contacting of the semiconductor device. At the same time the second layer and the third layer constitute a mechanical protective layer, in order to protect the subjacent functional layers and/or semiconductor devices. The first metal layer forms, for example, at least one portion of a top metallization layer of the semiconductor device. The subsection of the first metal layer forms the region of the first metal layer, on which the second metal layer and third metal layer are placed.

A metallization layer is defined within the scope of the invention as a plurality of electrically conducting metal tracks, which are arranged in a common level of metallization and which connect together in an electrically conducting manner the functional elements or the components of the semiconductor device or of an integrated circuit. Highly integrated circuits typically have several levels of metallization. The bottom level of metallization comprises the metallization layer that lies next to the semiconductor substrate. Said metallization layer is often called the MO layer. In contrast, the metallization layer, which is at a distance from the semiconductor substrate, is called the top level of metallization or the top layer of metallization ($M_{top}$ layer). The individual layers and levels of metallization are electrically insulated from each other by means of intermediate dielectrics, for example oxide layers. Electrically conducting connections between the metallization layers are carried out by so-called vias, i.e., with openings, filled with a conductive material, in the intermediate dielectrics.

Power semiconductors exhibit preferably only a single level or layer of metallization.

In some embodiments, the first metal layer is typically a soft metal layer and is made of a first metal, which is softer than the second and third metal. In this context "soft" and "hard" define relative properties of the individual metal layers. In one embodiment, the second metal layer and the third metal layer are made of a variety of different metals. For example, the third metal may be harder than the second metal. In one embodiment, the second metal layer and the third metal layer are approximately equally hard. That is, they are made in particular of the same metal.

Owing to the structuring of the second metal layer, which may also be called the hard metal layer, with an interrupted structure, the risk of a crack formation in the second metal layer is, for example, decreased or even prevented. In some embodiments, the second metal layer is no longer designed as a continuous layer, but rather in the shape of layer regions or metal islands that are laterally spaced apart. In some embodiments, the lateral extension of the individual layer regions or metal regions is chosen in such a manner that the formation of a crack inside a layer region is largely ruled out.

Cracks may also occur, among other things, due to the mechanical stresses inside the individual metal layers. As stated above in the introduction, mechanical stresses occur during the production of the individual layers, during bonding or owing to the varying degrees of expansion of the individual metal layers under thermal stress. Especially in the case of layered structures comprising layers with varying coefficients of expansion, cracks may develop under thermal stress. Thicker layers as well as layers with a relatively high lateral expansion tend to exhibit a higher degree of cracking. This applies especially to comparatively hard metal layers. Of course, thick hard metal layers lead to better protection, but simultaneously also exhibit a higher tendency to form cracks. Therefore, in some embodiments, at least one of the two hard metal layers and in particular a thick hard metal layer is constructed in such a manner that it consists of individual layer regions that are separated from each other. Owing to the slight lateral expansion of the individual layer regions, only comparatively slight mechanical stresses may occur inside each layer region. Therefore, the risk of a crack formation is significantly less than in the case of continuous layers. In addition, the layer regions limit the crack propagation. Owing to the interrupted structure, cracks, which may ultimately form in a layer region, cannot propagate into the neighboring layer regions. That is, the cracks are locally defined.

The effect of the structured hard layer may also be understood as follows. Owing to the structuring of the hard metal layer, "defined cracks" are introduced into this layer; and, thus, the stresses that would otherwise occur are largely reduced and eliminated. In this way the formation of other undefined cracks is largely avoided. The "defined cracks," i.e., the spaces between the layer regions, may be arranged in such a manner that they do not effect or disturb the other functional layers and the rest of the regions of the semiconductor device.

Metal layers that are structured in this way are very advantageous in power semiconductors and especially in individual power semiconductors. Power semiconductors are subject to some degree to considerable thermal stress. Since they switch high electric power, comparatively large amounts of thermal power is dissipated so that the power semiconductors become exceedingly warm. Therefore, the power semiconductors must also be correspondingly well electrically contacted. This is carried out, in some embodiments, by means of adequately thick bonding wires, which are placed on comparatively large contact elements (contact pads). Therefore, In one embodiment, the semiconductor device exhibits a power semiconductor, with which, for example, high voltages and/or high currents can be switched. The voltages to be switched are in an order of magnitude of a few hundred volts or higher and may range, for example, from 600 V to 7,000 V and above. In one embodiment, the semiconductor device exhibits at least one power semiconductor, which can switch voltages ranging from 600 V to 1,200 V. Power semiconductors in this performance class are produced on comparatively thin semiconductor wafers, which react in an especially sensitive way to mechanical stresses. Therefore, especially in the case of power semiconductors on thin wafers the structuring of the hard layer is very advantageous. Irrespective of the above, in some embodiments, the structured hard layer may also be used in integrated circuits for stress reduction. Then, the semiconductor device also comprises integrated circuits.

In order to dissipate from time to time with hardly any losses the power (high currents and high voltages), which is to be switched especially by power semiconductors, to the power semiconductors, the semiconductor device in one embodiment exhibits contact elements, which occupy a contact area of 0.01 mm$^2$ or larger, for example 0.5 mm$^2$ or 1 mm$^2$ and larger. Adequately thick bonding wires may be applied on such large bare contact areas. "Bare contact area" is defined as a section of the contact element that is not covered by a passivating layer and is bare for applying contact wires. In one embodiment, the contact wires exhibit a diameter ranging from about 100 μm to about 600 μm. Typical dimensions for contact areas are, for example, 2×3 mm.

In one embodiment, the contact elements are constructed of the second and third metal layer. Then the contact elements sit on at least one subsection of the first metal layer. At the same time the second metal layer and the third metal layer form together an intermediate layer for absorbing the mechanical stress. In one embodiment, the contact elements comprise at least one subsection of the first metal layer as well as the second and third metal layer.

In one embodiment, the second metal layer may be placed directly on the first metal layer and/or the subsection, independently of the respective embodiment. Similarly it is possible, in some embodiments, to sandwich the third metal layer directly between the first and the second metal layer.

In one embodiment, a contact layer is applied on the second metal layer. The contact layer protects the metal layers underneath, for example against corrosion. In addition, the contact layer may be made of a material of comparatively high conductivity, in order to guarantee the lowest possible contact resistance to a contact wire or bonding wire (bonding wire). In one embodiment, the contact layer may be made of a metal that is softer than the second metal. In another embodiment, the contact layer may also be made of a hard metal, which is just as hard or even harder than the second metal. In one embodiment, the contact layer is thinner than the second metal layer. In one embodiment, the contact layer is made of a metal, for example Au, that is suitable for bonding. The contact layer may also be made of two or more layers. In this case it is preferred that the top layer is an Au layer that covers a Pd layer.

In one embodiment, at least two layer regions of the second metal layer are covered by a single base of a contact wire or bonding wire. That is, the second metal layer, which lies directly under the contact wire, is structured and exhibits several layer regions especially in that location.

Thus, a contact wire is placed on the contact element and/or on the second metal layer. To the extent that a contact layer is provided, the contact wire is placed on the contact layer.

In one embodiment, only two layer regions per contact element are placed on the first and/or third metal layer. Each layer region serves, for example, only to apply a single contact wire. That is, only one contact wire is placed on each layer region. The size of the layer regions, i.e., their lateral expansion, may be adjusted to the size of the contact wires, so that only one contact wire may be applied reliably on a layer region. It is also possible that the contact elements exhibit three layer regions with one contact wire each. In these configurations a hard layer region is needed only where a contact wire shall actually be applied. In this way the size and the expansion of the layer regions and/or the second metal layer may be decreased, with the result that mechanical stresses may be avoided even better while simultaneously maintaining adequate protection.

In one embodiment, the layer regions of the second metal layer exhibit a spacing that is less than the lateral expansion of the layer regions. Therefore, the spacing is defined by the distance between two opposite edges of the adjacent layer regions.

In one embodiment, the area portion of the contiguous subsection of the first metal layer that is covered by the layer regions is higher than the area portion that is not covered by the layer regions. The layer regions may be spaced relatively closely together. Thus, on the one hand, adequate mechanical protection is guaranteed, but, on the other hand, a certain flexibility of the layer system comprising a first, second and optionally third layer is still enabled. The lateral expansion of the layer regions may range from 30 μm to 2,000 μm. Typically layer regions exhibit an average lateral expansion of about 100 μm especially when used in contact elements of semiconductor devices with power semiconductors.

In one embodiment, the subsection of the first metal layer and the layer regions of the second metal layer are placed over an active semiconductor device. Therefore, in a perpendicular projection on the semiconductor device, the subsection of the first metal layer and the layer regions of the second metal layer and optionally the third metal layer cover at least one subarea of the semiconductor device and form in this way a layered stack. Thus, a contact element sits on the semiconductor device. This configuration is also called the "bond on active area" and is used especially in power semiconductors that have a relatively large-area expansion.

The term metal (first, second, third metal or metal of the contact layer) is defined as materials that are made predominantly of a metal or a metal alloy. Therefore, it is within the scope of the invention if the metals or the metal alloys exhibit non-metals as the additives. In this context the second metal is in particular a boron-containing or phosphorus-containing metal or a boron-containing or phosphorus-containing metal alloy. In particular, the second metal is a metal or a metal alloy from the group NiP, NiB, CoWP, CoWB, NiWP, NiWB, NiCoP, NiCoB, NiMoP or NiMoB. Phosphorus and boron exist as the additive. For example, the second metal may contain 1% to 20% by weight of phosphorus. In addition, the second metal layer may also be made of other hard metals, for example, CoW, Ni or NiPd.

The third metal is also made preferably of a boron-containing or phosphorus-containing metal or a boron-containing or phosphorus-containing metal alloy. The third metal may be a metal or a metal alloy from the group NiP, NiB, CoWP, CoWB, NiWP, NiWB, NiCoP, NiCoB, NiMoP, NiMoB, NiPd, CoW, Ni or Cu. Phosphorus and boron may also be contained in the above percents by weight.

In this description the metals and the metal alloys are referred to—for the sake of simplicity—by the chemical symbols that are usually used.

The metals exhibit various degrees of hardness. In particular, the second metal is harder than the first metal. The hardness is determined according to the conventional methods and may be noted, for example, as Brinell hardness or Vickers hardness.

In one embodiment, an insulating layer is placed on a surface that faces the second metal layer and belongs to the first metal layer. In one embodiment, the insulating layer exhibits openings. Then the layer regions of the second and/or third metal layer sit in essence in the openings of the insulating layer. For example, the lateral expansion of the layer regions is defined in essence by means of the insulating layer and is used during production of the semiconductor device as the prestructured base for the selective growth of the layer regions on the regions that are not covered by the insulating layer. In one embodiment, adjacent openings of the insulating layer exhibit a spacing, measured from the respective outer edge of the openings, that is at least twice as large as the thickness of the layer regions. The insulating layer is made typically of an electrically insulating material.

According to a first embodiment, layer regions, made of at least one second metal that is harder than the first metal, may be formed on a substrate, which exhibits a first metal layer, in order to produce a semiconductor device. In one embodiment, an insulating layer comprising openings is applied, first of all, on the first metal layer, in order to form the layer regions. The openings define the size and the position of the layer regions. Then the layer regions are formed selectively in the openings of the insulating layer.

Figure 2A:
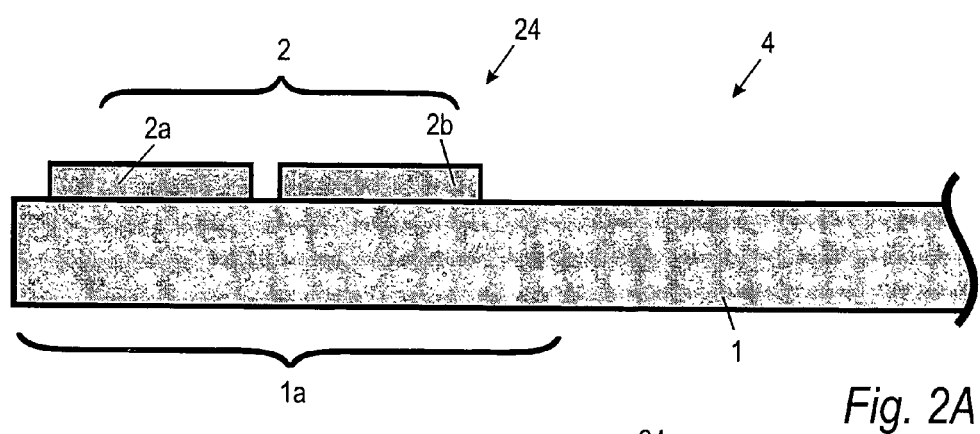
FIG. 2a is a sectional view, according to one embodiment.

As shown, for example, in FIGS. 1 and 2a, a semiconductor device 4 exhibits a first metal layer 1 and a second metal layer 2. The second metal layer 2 exhibits a plurality of island-shaped layer regions 2a and 2b, which are placed sequentially on the continuous first metal layer 1. The second metal layer 2 may exhibit a thickness of about 4 µm. The thickness of the second metal layer 2 depends, among other things, on the hardness of the material that is used and on the expected stresses and loads, to which the semiconductor device is subjected during the production of the layer, during its operation or during bonding. In general the thickness of the second metal layer 2 may range from about 1 µm to 10 µm.

The layer regions 2a and 2b of the second metal layer 2 are placed in essence exclusively on a subsection 1a of the first metal layer 1. For example, the first metal layer 1 may be a level of metallization, in particular the top level of metallization of an integrated circuit or the sole level of metallization of a power semiconductor. In this case the first metal layer 1 produces, for example, an electrically conducting connection between various components and/or structures of the integrated circuit or forms an electric feed line to a contact element 24, which is used for external contacting of the integrated circuit and/or the semiconductor device 4. The contact element 24 comprises the subsection 1a of the first metal layer 1 as well as the layer regions 2a and 2b of the second metal layer 2.

Figure 2B:
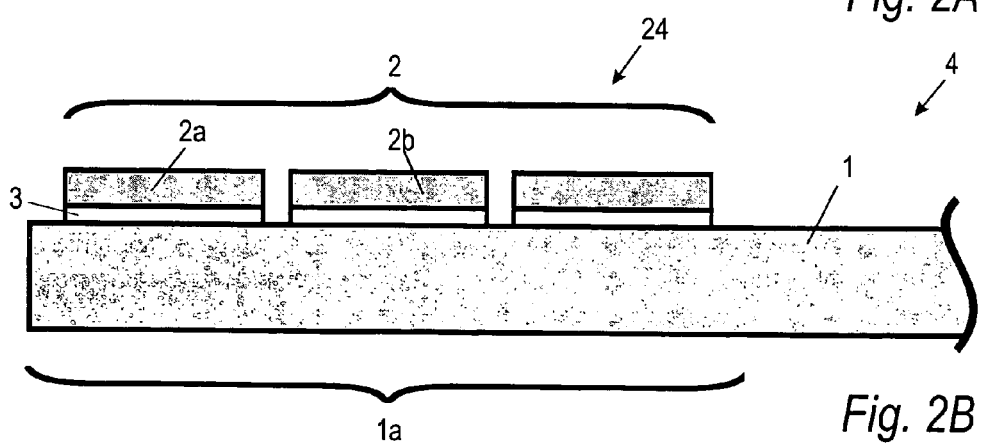
FIG. 2b is a sectional view, according to one embodiment.

A third metal layer 3 may be sandwiched between the first and the second metal layer, as shown, for example, in FIG. 2b. The third metal layer 2 is typically significantly thinner than the second metal layer 2 and may exhibit, for example, a thickness, ranging from 100 nm to 2 µm.

In comparison to the layer thickness of the second and the third metal layer 2 and 3, the first metal layer 1 is designed thicker in order to decrease the line resistance. Then the second and third metal layers 2, 3 define together with the subsection 1a of the first metal layer 1 the contact element, on which a contact wire (bonding wire) may be applied. Optionally the contact element also comprises other layers and in particular contact layers.

Figure 3:
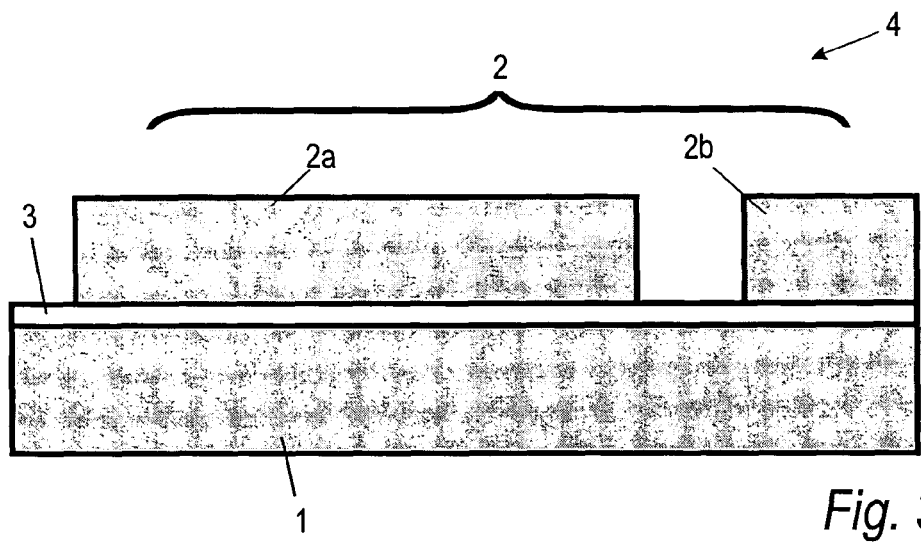
FIG. 3 is a sectional view, according to one embodiment.
Figure 4:
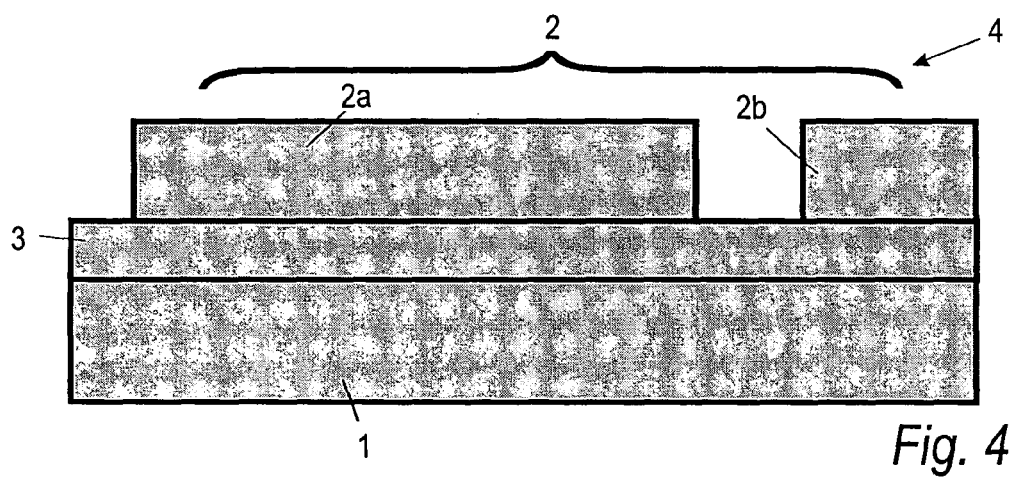
FIG. 4 is a sectional view, according to one embodiment.
Figure 5:
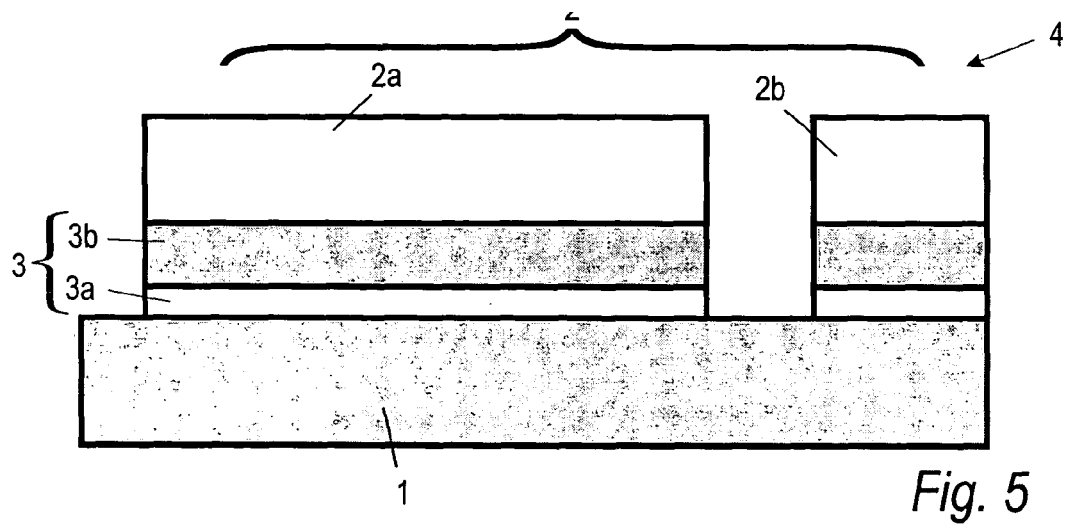
FIG. 5 is a sectional view, according to one embodiment.

The third metal layer 3 may also be designed thicker, as shown in FIG. 4. However, it is typically thinner than the second metal layer 2. To the extent that the third metal layer 3 is contiguous (FIGS. 3 and 4), its thickness ought to be adjusted in such a manner that no cracks develop. To avoid cracks, the third metal layer 3 is, therefore, also preferably structured; in particular, it forms together with the second metal layer 2 the layer regions 2a and 2b. In FIGS. 1 to 3, the second metal layer 2 is made of a material that is different from that of the third metal layer 3. In contrast, FIG. 4 shows a semiconductor device 4, where the second and third metal layers 2, 3 are made of the same material. FIG. 5 shows a semiconductor device 4 with a third metal layer 3, which exhibits two metal sublayers 3a and 3b. Therefore, one of the metal sublayers 3a and 3b, for example, the metal sublayer 3a, facing the first metal layer 1, may be made of the same material as the second metal layer 3.

Figure 6:
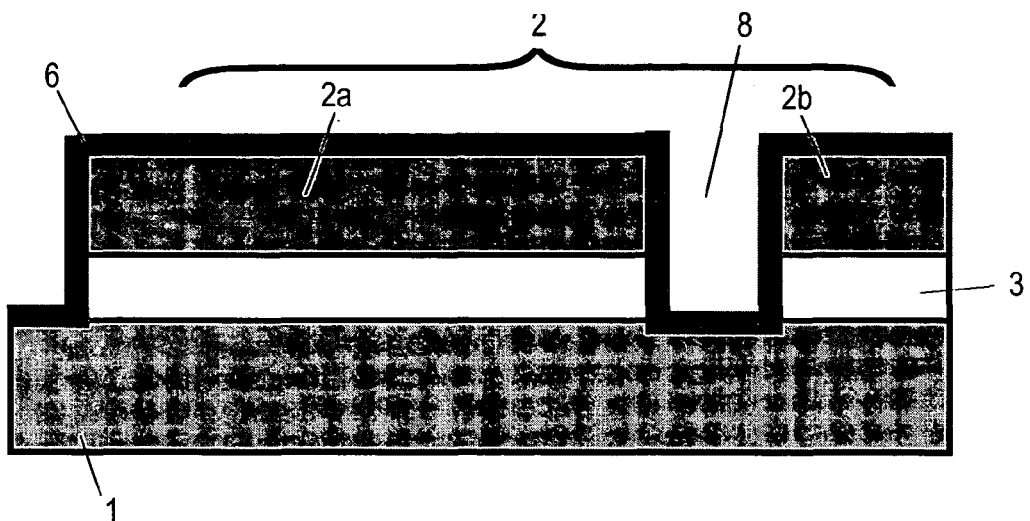
FIG. 6 is a sectional view, according to one embodiment.

In FIG. 6 the second metal layer 2 is covered in a conforming manner with a comparatively thin contact layer 6. However, the contact layer 6 may also be configured thicker so that the spaces 8 between the layer regions 2a and 2b can be filled with the material of the contact layer 6.

The second metal layer 2 may be made, for example, of NiP or NiMoP. In particular, NiP is a comparatively hard metal. The hardness of NiP may be modified by means of the phosphorus content. NiMoP is also a hard metal, the hardness of which may be adjusted by means of the phosphorus content. NiMoP is somewhat softer, compared to NiP, and may, therefore, be configured as the thicker layer, as compared to an NiP layer.

The third metal may also be made preferably of NiP or NiMoP. The first metal may be a metal or a metal alloy from the group Al, Cu, Al alloy, Cu alloy, AlCu alloy, AlSi alloy or AlSiCu alloy.

The contact layer may be made of a metal or metal alloy from the group NiP, NiB, CoWP, CoWB, NiWP, NiWB, NiCoP, NiCoB, NiMoP, NiMoB, NiPd, CoW, Ni, Cu, Al, Pd or Au. The thickness of the contact layer 6, which may also be constructed as the continuous hard layer, is determined by its crack resistance. The crack resistance decreases as the thickness of the respective layer decreases. For example, to the extent that the third metal layer 3 is made of a very hard metal, for example NiP, and is configured as a continuous layer, the third metal layer 3 is constructed correspondingly thin and exhibits then a thickness ranging from about 0.1 µm to 2 µm. When a metal is used for the third metal layer 3 that is softer than the material for the second metal layer 2, said third metal layer may also be configured somewhat thicker, so that even a layer thickness of up to about 3 µm is possible. Preferably the third metal layer 3 and the contact layer 6 are thinner than the second metal layer; and the contact layer 6 covers in a conforming manner the second metal layer so that spaces remain.

Specific examples for the metals that are used are represented by the embodiments of FIGS. 1 to 3. In this respect the first metal of the first metal layer 1 is typically an AlSiCu alloy and in particular an AlSi alloy. In FIGS. 1 to 6 the layer regions 2a and 2b of the second metal layer 2 are made of NiMoP; and the third metal layer 3, sandwiched between the first and the second metal layers 1, 2, is made of NiP. Since NiP is very hard, the third metal layer 3 is correspondingly thin in order to avoid the formation of cracks. In FIG. 4, the third metal layer 3, which is configured as a contiguous layer, is made of NiMoP, just like the layer regions. In FIG. 5, the third metal layer 3 comprises two metal sublayers 3a and 3b, where in this case the metal sublayer 3a, facing the first metal layer 1, is made of NiP; and the metal sublayer 3b, facing the second metal layer 2, is made of NiMoP. In this case the second metal layer 2 is made of NiP. In this embodiment the metal sublayer 3a is thinner than the metal sublayer 3b. In FIG. 6 there is also a contact layer 6 on the third layer 3, which is made of Pd, Au or an alloy of Pd and Au. Here, too, the layer regions 2a, 2b are made of NiMoP; and the third metal layer 3 is made of NiP.

In particular, the use of NiMoP as the second metal and NiP as the third metal has proven to be beneficial with respect to reinforcing the contact element in order to decrease the mechanical stresses in the layered stack when the mechanical stability and hardness are comparatively high. The layer combination of NiP and NiMoP can also be easily produced, for example, by currentless electrodeposition.

The bonding wires may be made, for example, of aluminum, copper or gold. Aluminum wires or copper wires are often used in power semiconductors for bonding.

During a bonding process, the hard second metal layer 2 protects, for example, the functional layers underneath. For electrical contacting, for example, of a power semiconductor, a bonding wire or a contact wire is connected to the power semiconductor and in particular to the contact area of a contact element that is provided for this purpose. Therefore, the wire having a high mechanical force is applied on the contact area preferably with the simultaneous use of ultrasound. The resulting mechanical stress is absorbed at least partially by the hard second metal layer 2. Compared to the contact elements, which do not exhibit any hard metal layer, the wire may be pressed down on the contact area even with a comparatively high pressure force without destroying thereby the structures and functional elements located underneath the contact element. In addition, it is possible to use harder bonding wires that also lead to an improved mechanical connection and an improved electric contact.

Figure 8:
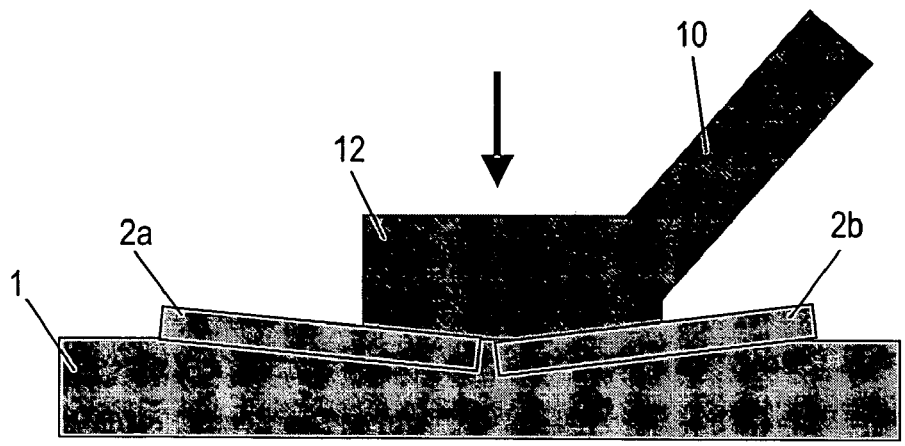
FIG. 8 is a schematic view of the stress effect while bonding.

It is advantageous if the third metal layer 3, located between the second metal layer 2 and the first metal layer 1, is also a hard metal layer, as compared to the first metal layer 1. The structuring of the hard second metal layer 2 results in separate metal pads or layer regions 2a and 2b, which may be moved towards each other under the influence of force. Without the use of, for example, a continuous hard third layer 3, the layer regions 2a, 2b of the second metal layer 2 would be pushed to some degree into the underlying layers, as shown, for example, in FIG. 8. FIG. 8 depicts a bonding wire 10, which is pushed with one of its ends 12 under a high pressure force (shown by means of the vertical arrow pointing downward) perpendicularly to the surface of the layer regions 2a and 2b. Therefore, the end 12 of the wire 10 is deformed and thus forms a base 12 of the wire 10 that is connected to the layer regions 2a and 2b. Under the influence of the pressure force, the layer regions 2a and 2b penetrate to some degree the first metal layer 1 underneath. In so doing, the first metal layer 1 is plastically deformed to some extent. A continuous hard third metal layer 3 prevents such a penetration.

Figure 9A:
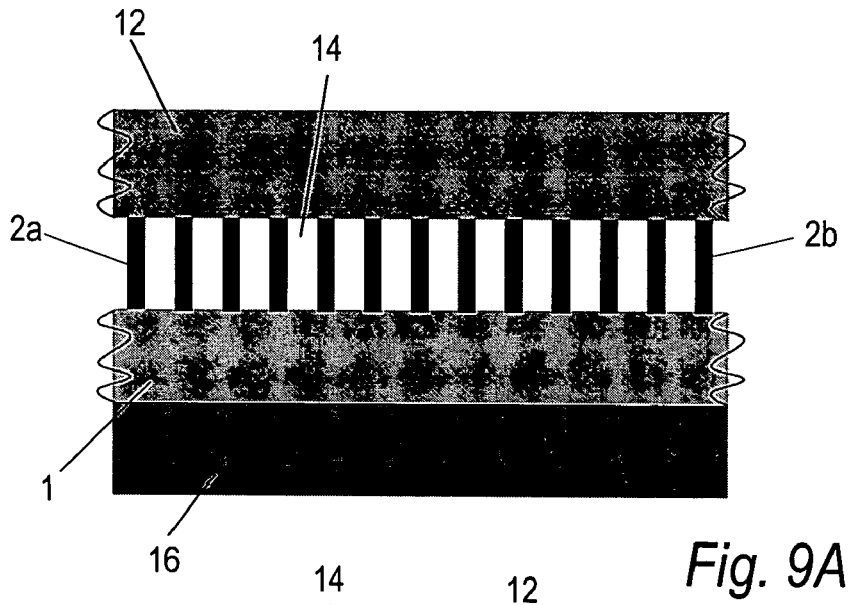
FIGS. 9A and 9B are schematic views of the stress absorption, according to one embodiment.
Figure 9B:
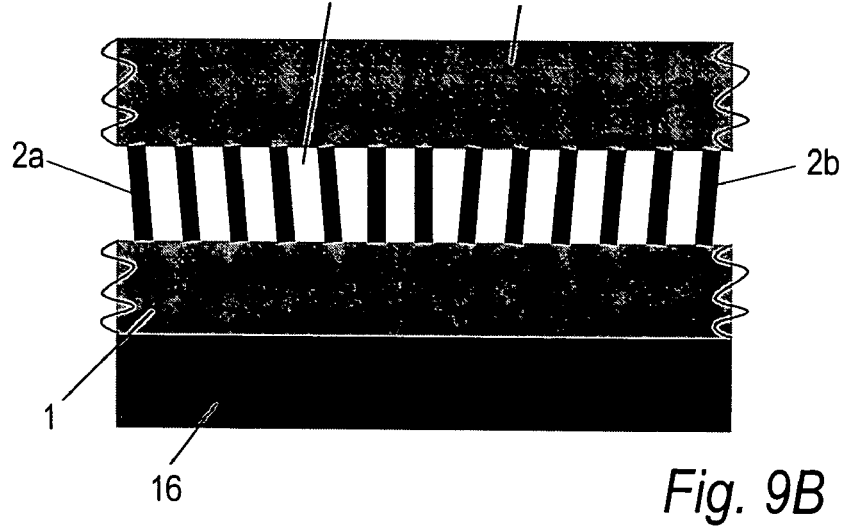
Figure 10A:
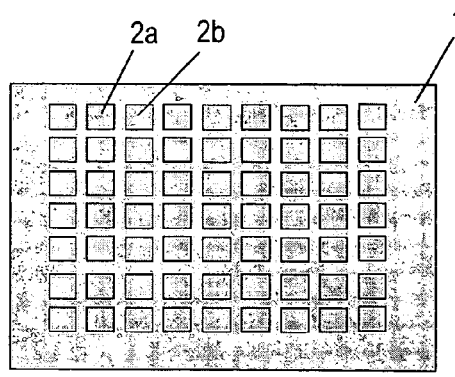
FIGS. 10A to 10E depict a variety of geometric configurations of the second metal layer.
Figure 10B:
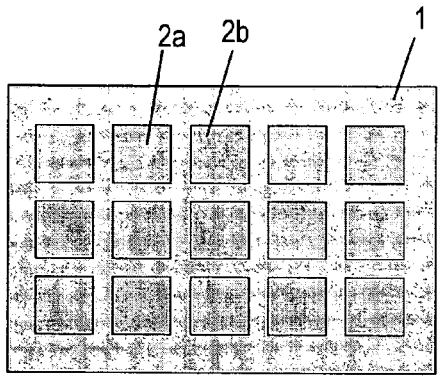
Figure 10C:
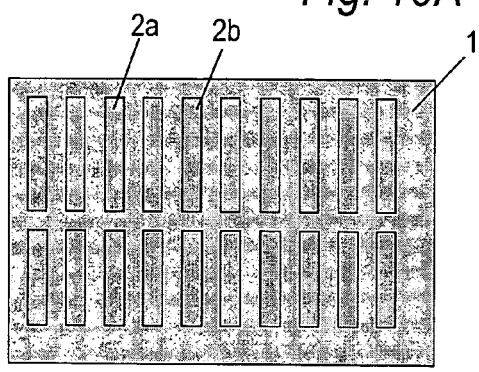
Figure 10D:
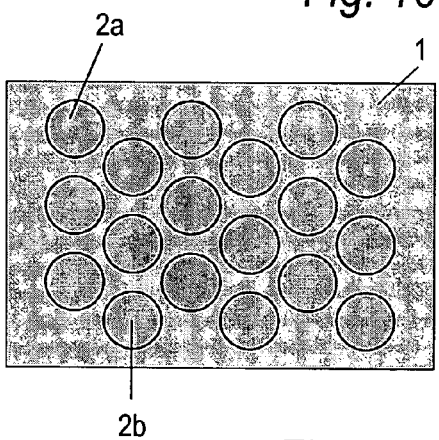
Figure 10E:
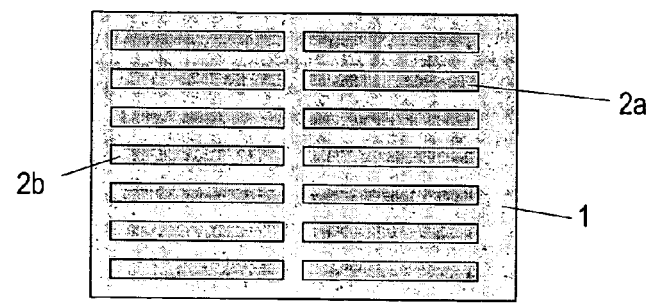

The interaction between the metal layers during self-heating of an integrated circuit and/or a power semiconductor is shown in FIGS. 9A and 9B. FIG. 9A depicts the metal layers at normal temperature, at which the individual metal layers are not under any stress or under only slight stress. The first metal layer 1 is placed on a silicon substrate 16. If the integrated circuit and/or the power semiconductor is heated up, for example, owing to the resistive power dissipation during operation, the layers expand differently. Thus, for example, aluminum has a thermal coefficient of expansion $\alpha_{Al}$ of about $23.8 \times 10^{-6} \text{K}^{-1}$; silicon has a thermal coefficient of expansion $\alpha_{si}$ of about $2.6 \times 10^{-6} \text{K}^{-1}$ and copper has a thermal coefficient of expansion $\alpha_{cu}$ of about $16.5 \times 10^{-6} \text{K}^{-1}$, just to name a few materials that are typically used. The thermal stress may be very high especially in power semiconductors. Therefore, power semiconductors must remain functional even at operating temperatures of about 125 deg. C and above. The high thermal stress occurs, especially when correspondingly high power is delivered, i.e., when a high current flows through the power semiconductor. However, in the off state, very little power is dissipated. The power semiconductor "cools" down a little. Therefore, both the thermal stress and-owing to the different coefficients of expansion of the individual layers-also the mechanical stress fluctuate. In its interaction with the third metal layer 3, which is also structured, and the soft first metal layer 1, the structured second metal layer 2 may absorb at least to some degree or may largely absorb the stresses that arise. The layered stack, formed by the metal layers, acts as a stress absorption layer.

FIG. 9B shows that the layer regions 2a and 2b absorb the stresses. The layer regions 2a and 2b compensate to some degree for the mismatch between the power semiconductor and the bonding wire and/or its base 12, since the layer regions 2a and 2b may move not only in the soft metal of the bonding wire base 12, but also in the soft first metal of the first metal layer 1. The space 14 between the layer regions 3a and 3b may be devoid of material or may be filled with a soft material, for example, the material of the bonding wire 10. In this case the layer regions 2a and 2b act as "cross bars," which may expand up to a certain amount. On the whole, the result is a longer lifespan of the bond connection. Owing to the additional optimization of the bonding parameters (material, pressure force, ultrasonic energy, etc.), the bond connection may be improved and the efficiency may be increased.

The stress reduction due to the structuring especially of the comparatively thick and hard second metal layer 2 also has in general a positive effect in the case of the expanded thin layers and the correspondingly thin semiconductor wafers. Owing to the mechanical stresses the thin wafers and/or the semiconductor substrates tend to deform (bimetal effect). Owing to the structuring of the second metal layer 2, these stresses are prevented. Therefore, even hard metal layers may be integrated into "thin" wafers and in particular "thin" power semiconductors so that even in this case higher pressure forces can be used in bonding and/or with harder bonding wires. A thermally induced deformation can also be largely avoided. In addition, an additional layer can be applied on the back side of thin wafers in order to compensate for the stresses. Therefore, a deformation of the wafer may be significantly reduced.

Figure 7:
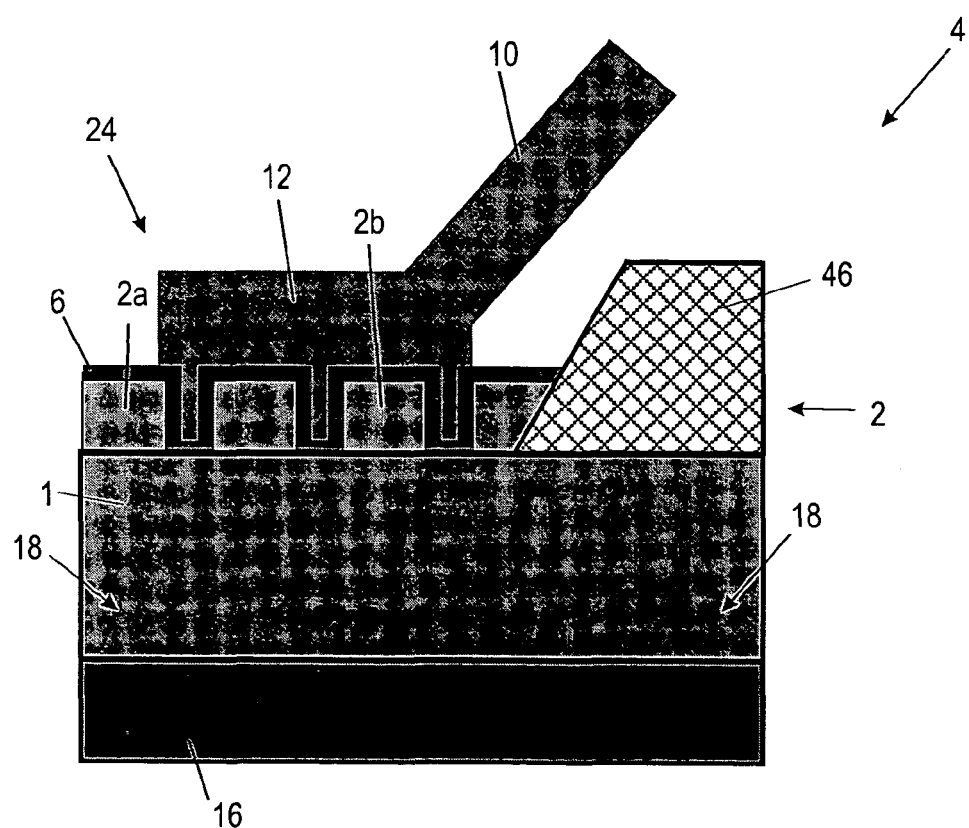
FIG. 7 is a sectional view of a semiconductor device, according to one embodiment with an applied contact wire.

FIG. 7 depicts a semiconductor device 4 comprising a semiconductor substrate 16 made of, for example, Si with active components 18, integrated therein. Therefore, it relates to a plurality of different components and/or parts of a single component. The active element(s) of power semiconductors is/are, for example, IGBTs, high voltage diodes or power MOSFETs, which must be correspondingly contacted. In addition, a contact element 24 is disposed above the active element(s) 18. That is, active regions of the semiconductor device ("bond on active area") are located below the bond area (contact area of the contact element). In particular in the configuration depicted in FIG. 7, the use of a hard structured second metal layer 2 is advantageous, since the active regions of the semiconductor device that lie under these layers can be protected; and one can still work under harder bonding conditions.

Figure 11:
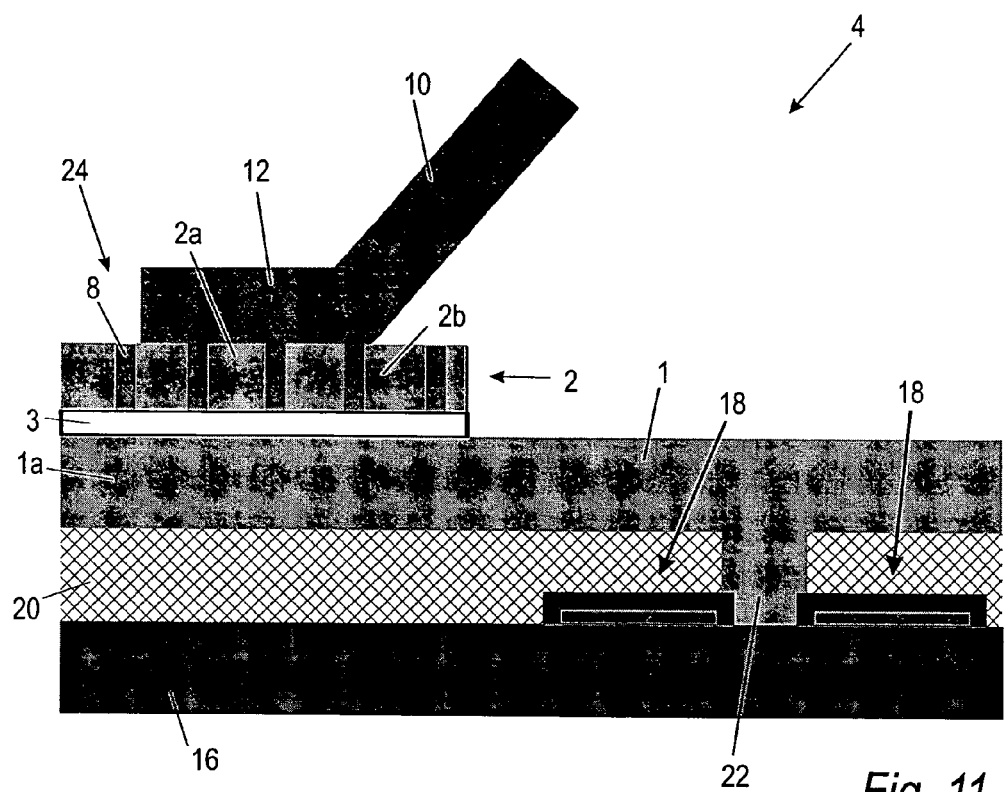
FIG. 11 depicts an embodiment of a semiconductor device with an applied bonding wire.

FIG. 11 depicts a semiconductor device 4 comprising a contact element 24, which is arranged so as to be laterally offset in relation to the active components 18. The contact element 24 is placed on a subsection 1a of the first metal layer 1 and/or comprises this subsection. The space 8 between the layer regions 2a and 2b of the second metal layer 2 is filled with the material of the bonding wire. This may take place, for example, during the bonding process. A contact layer is not provided, but may be applied additionally on the layer regions 2a and 2b. The first metal layer 1 represents here the top metallization layer of the integrated circuit and/or of the semiconductor device. The first metal layer 1 is connected in an electrically conductive manner to the underlying metallization layers and/or the underlying doping regions of the active components 18 by way of vias 22. An intermediate dielectric 20 is disposed between the metallization layers.

In the FIGS. 10A to 10E a variety of geometric shapes of the layer regions 2a and 2b of the second metal layer 2 are shown in a top view.

Figure 13A:
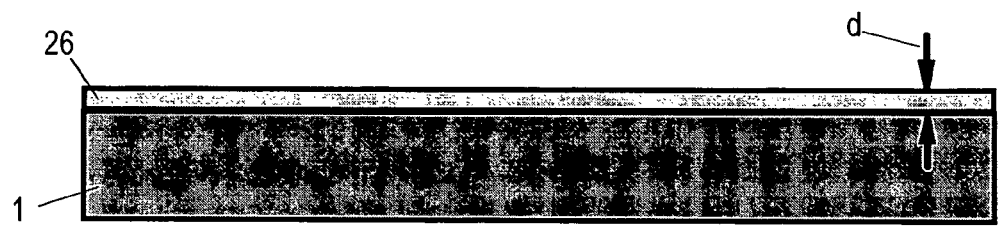
FIGS. 13A to 13C show the individual method steps in the production of a semiconductor device.
Figure 13B:
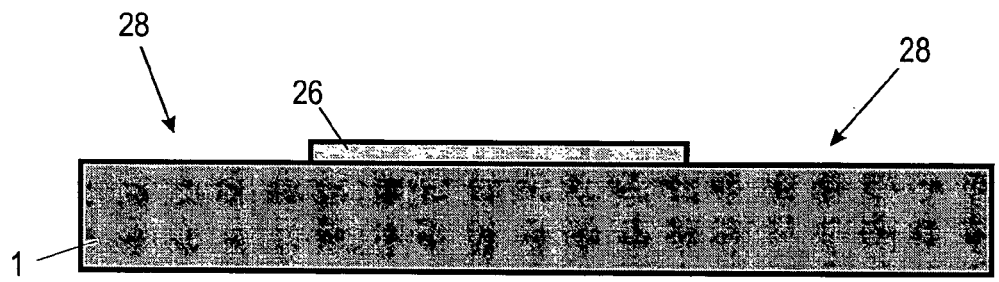
Figure 13C:
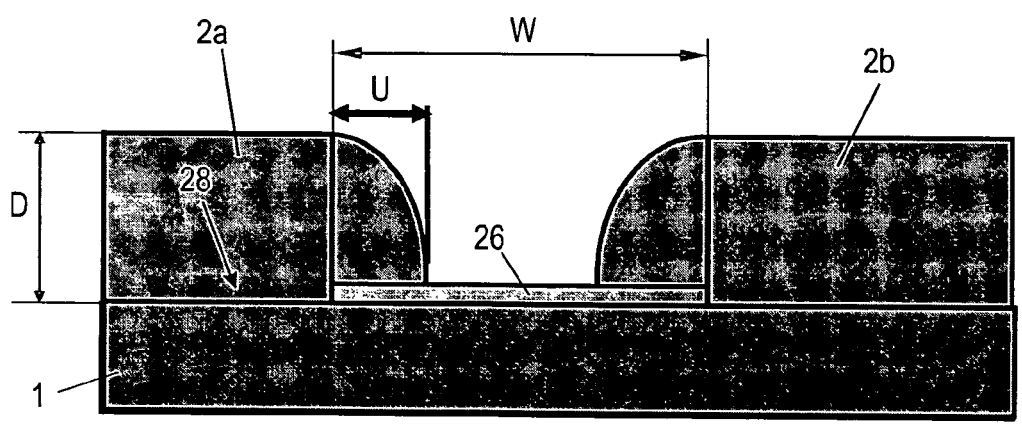

FIGS. 13A to 13C depict one embodiment of a production process for the production of a semiconductor device. First, a substrate (not illustrated) is provided with a first metal layer 1. The metal layer 1 may be already structured. For example, the first metal layer 1 may form a conductor track. Then an insulating layer 26, made of an insulating material, is applied on the surface of the first metal layer 1.

The insulating layer 26 is suitably structured, as shown in FIG. 13B, for forming openings 28. The insulating layer 26 may be very thin, since it is supposed to passivate only the regions of the first metal layer 1, on which no deposition of layer regions is desired. For example, the layer thickness d of the insulating layer 26 may be 40 nm.

As shown in FIG. 13C, the second metal layer 2 is selectively grown on the regions of the first metal layer 1 that are bare in the openings 28, for example, by a currentless electrodeposition process. Therefore, the structured insulating layer 26 defines the position and the size of the layer regions 2a and 2b. During the selective growth of the layer regions 2a and 2b, "overgrowth" may develop on the edge regions of the insulating layer 26 (mushroom plating). The scale U of the lateral overgrowth is approximately in the order of magnitude of the deposited layer thickness D of the layer regions 2a and 2b. Therefore, to prevent the layer regions 2a and 2b from growing together, the distance W between the openings 28 should be as large as twice the layer thickness D of the finished layer regions 2a and 2b.

In particular NiP, NiB, CoWP, CoWB, NiWP, NiWB, NiCoP, NiCoB, NiMoP, NiMoB, NiPd, Ni and Cu can be deposited by currentless electrodeposition or with an electrogalvanic deposition process. In a galvanic deposition process the metal(s) to be deposited are provided as ions in a solution. In the electrogalvanic deposition process the first metal layer serves as the cathode so that the positive metal ions are reduced and can be deposited. To this end, an anode has to be rendered soluble; and a suitable voltage is applied between the anode and the cathode. In currentless deposition a reducing agent is required to reduce the metal ions. To the extent that a boron-containing or phosphorus-containing metal or metal alloy is deposited without current, sodium hypophosphite or dimethyl borane may be used as the reducing agent. The reduction is catalyzed on the bare surface of the first metal layer 1.

If necessary, a starting layer (barrier/seed layer) may be applied prior to the deposition of the second metal layer 2. In this way the growth of the material, especially with the aforementioned materials, may be improved. The function of the starting layer may also be taken over by the third metal layer 3. The third metal layer 3 may also be galvanically deposited.

As an alternative, it is possible to apply then the second and optionally the third metal layer 2, 3 over the entire surface and thereafter to structure, for example, with the use of a mask.

Prior to the deposition of the layer regions, a passivating layer 46 (see FIG. 7) may be applied on the first metal layer 1. The passivating layer 46 leaves bare only those regions of the first metal layer 1, on which the contact elements are to be formed. Thus, the passivating layer 46 and/or the openings, provided in the passivating layer 46, define in essence the expansion of the contact elements. It must be noted that the passivating layer 46 is preferably significantly thicker than the insulating layer 26. In addition, the openings in the passivating layer match approximately the expansion of the contact elements, whereas, in contrast, the openings 28 of the insulating layer 26 are significantly smaller so that several openings 28 of the insulating layer 26 lie in one opening of the passivating layer 46

Furthermore, it is also possible to apply the semiconductor device alone or with other semiconductor devices on a carrier in order to form a semiconductor module. Therefore, the semiconductor device may be soldered with its back side on the carrier; and the contact wires may be bonded on the contact elements, located on the front side of the semiconductor device. If necessary, the semiconductor device(s) may be encapsulated with a suitable material in a final step.

Figure 12:
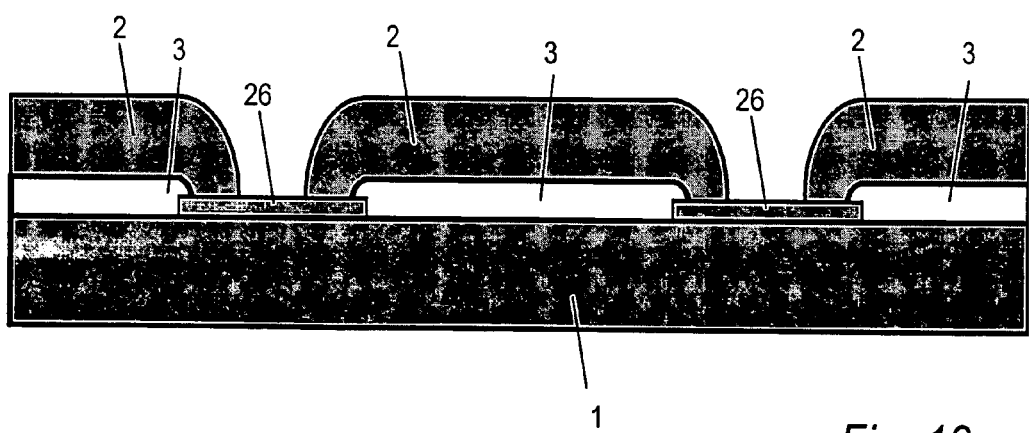
FIG. 12 is a sectional view according to one embodiment.

FIG. 12 shows one embodiment, in which the third layer 3 and the second layer 2 were deposited currentlessly. In a first step the third layer 3 grows selectively on the regions of the first metal layer 1 that are not covered by the insulating layer 26. Thus, it grows to some extent laterally over the insulating layer 26. Then the second layer 2, which is thicker in comparison, grows completely over the third layer 3 in such a manner that the layer regions do not grow together.

Figure 14:
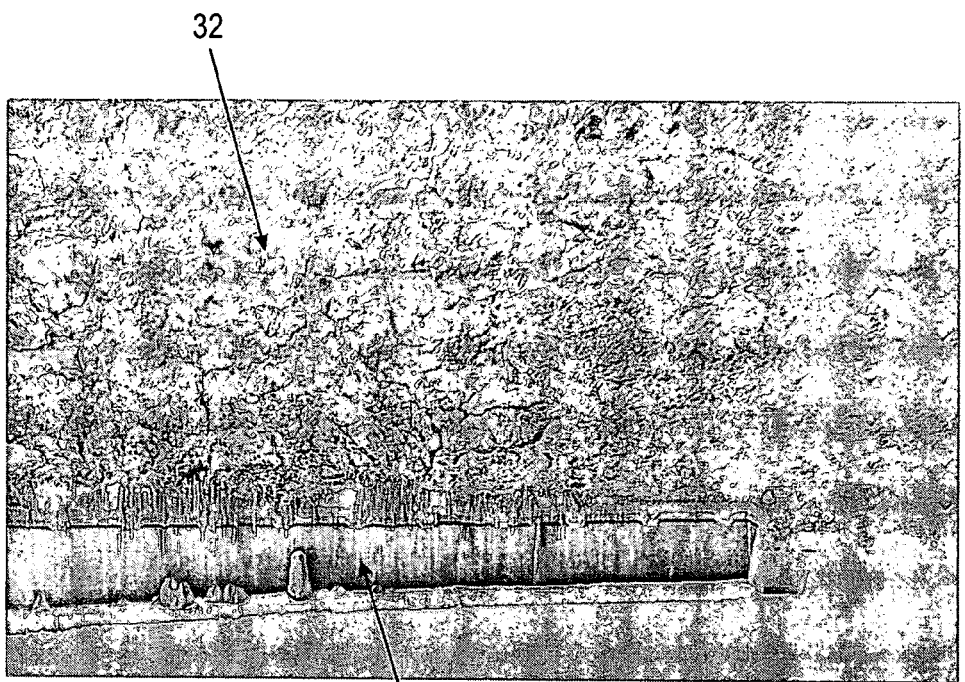
FIG. 14 shows a scanning electron microscopy image of a power semiconductor with a contact element.

FIG. 14 shows a scanning electron microscopy image of a power semiconductor. The transistor cell is labelled 30; and the bonding connection is labelled 32. The bonding connection 32 sits on the transistor cell 30.

Figure 15:
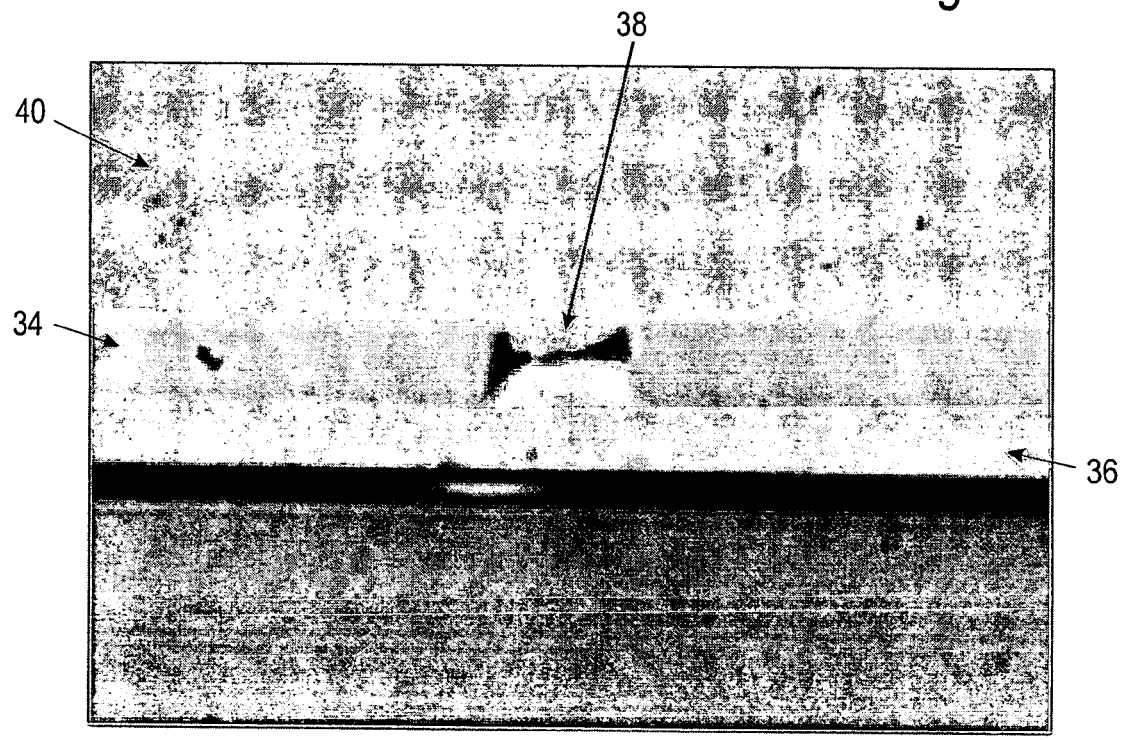
FIG. 15 shows a microscopy image of a sectional view of a semiconductor device with a contact element.

FIG. 15 shows a microscopy image of a sectional view of a power semiconductor device with a structured NiP layer 34, which represents here the second metal layer. The NiP layer 34 is covered with a contact layer, made of Pd and Au (not visible here), and sits on an AlSiCu metallization layer 36. The space 38 between the individual layer regions of the NiP layer 34 is partially filled with the material (here aluminum) of the applied bonding wire 40 and partially with the material of the AlSiCu metallization layer 36. As evident from FIG. 15, the layer regions of the NiP layer 34 were pushed partially into the AlSiCu metallization layer 36 and, therefore, can move not only in the soft aluminum of the bonding wire 40, but also in the AlSiCu metallization layer 36. That is, they "swim" in these materials to a certain extent. Thus, a mismatch between the power semiconductors (chip) and the bonding wire may be compensated for at least to some degree.

Figure 16:
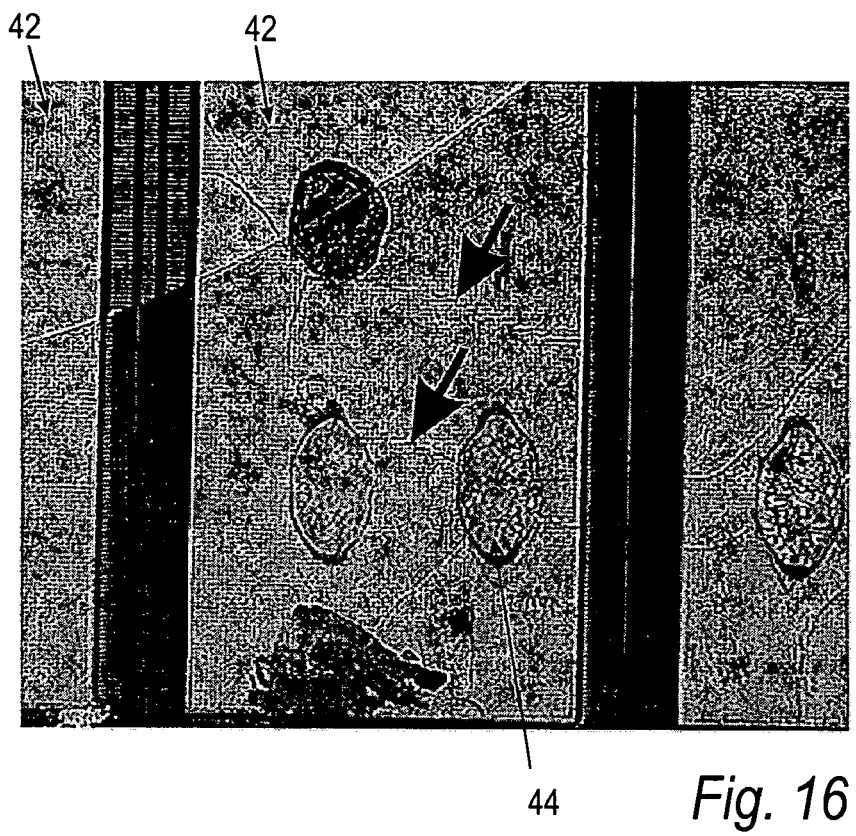
FIG. 16 shows a light microscopy image of a continuous hard metal layer with crack formations.

FIG. 16 shows a light microscopy image of a hard and large-area metallization. The expanded NiP layers, which exhibit several cracks indicated by thick arrows, are labelled 42. The imprints of the bonding wires are marked 44. The NiP layers 42 are not structured below the bonding wires. Therefore, these areas exhibit stresses that may lead to cracks.

Figure 17:
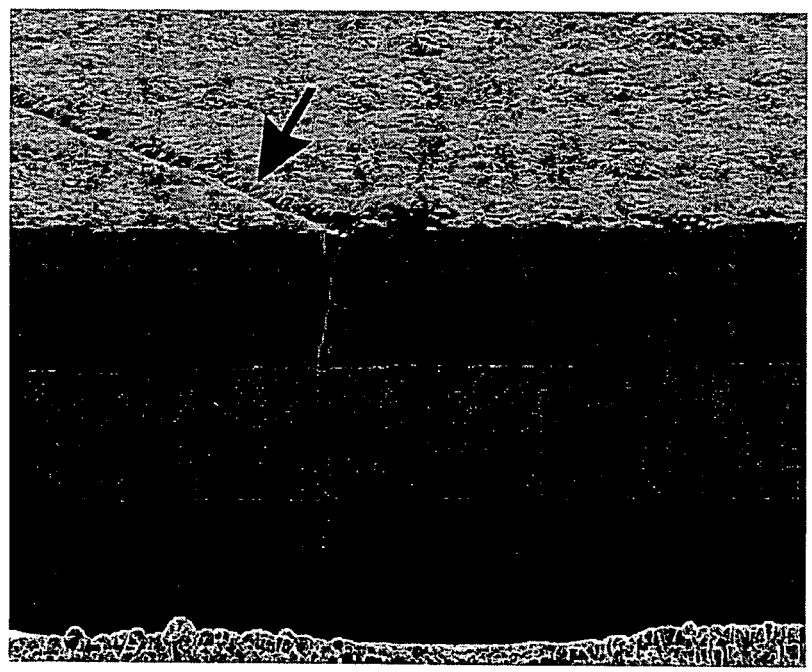
FIG. 17 shows a scanning electron microscopy image of a continuous hard metal layer with crack formations.

In contrast, FIG. 17 shows a scanning electron microscopy image. One can see clearly the cracks (marked by arrows) in the large-area NiP layer, covered with a Pd/Au contact layer.

What is claimed is:

1. A power semiconductor device comprising
a first metal layer, which is made of a first metal and comprises at least one contiguous subsection, and
at least one second metal layer, which is made of a second metal and is placed on at least the contiguous subsection of the first metal layer;
wherein
the second metal is harder than the first metal;
the second metal layer is structured to form a plurality of layer regions discontinuous from each other, and which are disposed on the contiguous subsection of the first metal layer;
the layer regions of the second metal layer are laterally spaced apart from each other by a spacing that is less than their respective lateral expansion; and
each of the plurality of layer regions of the second metal layer comprises a boron-containing or phosphorus-containing metal or a boron-containing or phosphorus-containing metal alloy.

2. The semiconductor device according to claim 1, wherein the first metal layer is the top metallization layer of the semiconductor device.

3. The semiconductor device according to claim 1, wherein a third metal layer, made of a third metal, is sandwiched between the first metal layer and the second metal layer.

4. The semiconductor device according to claim 1, wherein the second metal layer is placed directly on the first metal layer.

5. The semiconductor device according to claim 3, wherein the second metal layer is placed directly on the third metal layer.

6. The semiconductor device according to claim 3, wherein the third metal is harder than the first metal.

7. The semiconductor device according to claim 3, wherein the third metal is a boron-containing or phosphorus-containing metal or a boron-containing or phosphorus-containing metal alloy.

8. The semiconductor device according to claim 3, wherein the second metal layer and the third metal layer are structured jointly to form layer regions.

9. The semiconductor device according to claim 3, wherein the third metal layer on the subsection of the first metal layer forms a contiguous layer.

10. The semiconductor device according to claim 1, wherein at least one contact wire is placed on the second metal layer.

11. The semiconductor device according to claim 10, wherein the diameter of the contact wire is greater than or equal to 500 µm.

12. The semiconductor device according to claim 1, wherein the subsection of the first metal layer, on which the layer regions of the second metal layer are placed, forms a contiguous area that is greater than or equal to 0.01 mm$^2$.

13. The semiconductor device according to claim 1, wherein each layer region of the second metal layer has a lateral expansion between 30 µm and 2,000 µm.

14. The semiconductor device according to claim 3, wherein the third metal layer is thinner than the second metal layer.

15. The semiconductor device according to claim 3, wherein the third metal layer comprises at least two metal sublayers, which are stacked one above the other.

16. The semiconductor device according to claim 3, wherein the third metal is harder than the second metal.

17. The semiconductor device according to claim 1, wherein the second metal layer on a surface, which is facing away from the first metal layer, is covered by a contact layer.

18. The semiconductor device according to claim 17, wherein the contact layer is made of a metal that is suitable for bonding.

19. The semiconductor device according to claim 1, wherein an insulating layer is placed on a surface of the first metal layer that faces the second metal layer.

20. The semiconductor device according to claim 19, wherein the insulating layer comprises openings; and the layer regions of the second metal layer sit in essence in the openings of the insulating layer.

21. The semiconductor device according to claim 20, wherein the adjacent openings of the insulating layer comprise a spacing, measured from the respective outer edge of the openings, that is at least twice as large as the thickness (D) of the layer regions of the second metal layer.

22. The semiconductor device according to claim 1, wherein the second metal is a metal or a metal alloy from the group NiP, NiB, CoWP, CoWB, NiWP, NiWB, NiCoP, NiCoB, NiMoP or NiMoB.

23. The semiconductor device according to claim 3, wherein the third metal is a metal or a metal alloy from the group NiP, NiB, CoWP, CoWB, NiWP, NiWB, NiCoP, NiCoB, NiMoP NiMoB, NiPd, CoW, Ni or Cu.

24. The semiconductor device according to claim 1, wherein the first metal is a metal or a metal alloy from the group Al, Cu, Al alloy, Cu alloy, AlCu alloy, AlSi alloy or AlSiCu alloy.

25. A semiconductor device, comprising:
a semiconductor substrate comprising at least one active power semiconductor device integrated therein;
a first metal layer, which is made of a first metal and which comprises at least one subsection, which is placed over the active power semiconductor device;
at least one second metal layer, which is made of a second metal and which is placed on at least one subregion of the first metal layer; and
a contact wire, placed on the second metal layer;
wherein
the second metal is harder than the first metal;
the second metal layer comprises an interrupted structure; and
the second metal comprises a boron-containing or phosphorus-containing metal or a boron-containing or phosphorus-containing metal alloy.

26. The semiconductor device according to claim 25, wherein the interrupted structure is made of layer regions that are separated from one another.

27. The semiconductor device according to claim 25, wherein a third metal layer, made of a third metal, is sandwiched between the subsection of the first metal layer and of the second metal layer.

28. A contact element comprising:
a layered stack, which comprises at least one continuous subregion of a top metallization layer of a semiconductor device and an intermediate layer for the absorption of mechanical stress during a contact process for the contacting of the semiconductor device;
wherein
the intermediate layer comprises a plurality of layer regions that are separated from each other and that are placed on the continuous subregion of the first metal layer, the layer regions of the intermediate layer are laterally spaced apart from each other by a spacing that is less than their respective lateral expansion; and the layer regions comprises at least one boron-containing or phosphorus-containing metal or a boron-containing or phosphorus-containing metal alloy.

29. The contact element according to claim 28, wherein the layer regions are made of a metal that is harder than the metal of the top layer of metallization.

30. The contact element according to claim 28, wherein the layer regions comprise at least two metal layers that are made of different metals and that are stacked one on top of the other.

31. The semiconductor device of claim 1, wherein the at least two layer regions of the second metal layer do not overlap each other.

32. The semiconductor device of claim 1, wherein the at least two layer regions of the second metal layer are made of a same material.

33. The semiconductor device of claim 26, wherein the layer regions of the interrupted structure do not overlap each other.

34. The semiconductor device of claim 26, wherein the layer regions of the interrupted structure are made of a same material.

35. The contact element of claim 28, wherein the at least two layer regions of the intermediate layer do not overlap each other.

36. The contact element of claim 28, wherein the at least two layer regions of the intermediate layer are made of a same material.

37. The semiconductor device according to claim 1, wherein the area portion of the contiguous subsection of the first metal layer that is covered by the plurality of layer regions of the second metal layer is higher than the area portion that is not covered by the plurality of layer regions of the second metal layer.

* * * * *